(12) United States Patent
Yamamoto

(10) Patent No.: US 7,896,047 B2
(45) Date of Patent: Mar. 1, 2011

(54) SEMICONDUCTOR WAFER MOUNT APPARATUS

(75) Inventor: Masayuki Yamamoto, Osaka (JP)

(73) Assignee: Nitto Denko Corporation, Osaka (JP)

( * ) Notice: Subject to any disclaimer, the term of this patent is extended or adjusted under 35 U.S.C. 154(b) by 796 days.

(21) Appl. No.: 11/819,988

(22) Filed: Jun. 29, 2007

(65) Prior Publication Data

US 2008/0023149 A1 Jan. 31, 2008

(30) Foreign Application Priority Data

Jul. 31, 2006 (JP) .............................. 2006-208117

(51) Int. Cl.
*B32B 41/00* (2006.01)
(52) U.S. Cl. ...................... 156/378; 156/510; 156/515; 156/584
(58) Field of Classification Search ................. 156/510, 156/515, 535, 345.12, 378, 584; 438/459; 451/5, 6, 8
See application file for complete search history.

(56) References Cited

U.S. PATENT DOCUMENTS 7,078,262 B2    7/2006   Yamamoto et al.

2002/0173229 A1*   11/2002   Kobayashi ..................... 451/5
2004/0097054 A1*   5/2004    Abe ........................... 438/460
2005/0101103 A1*   5/2005    Yamamoto ................... 438/455
2006/0068524 A1*   3/2006    Yamamoto ................... 438/118

FOREIGN PATENT DOCUMENTS

| CN | 1422791 A   |   | 6/2003 |
| JP | 2002-299196 A |  | 10/2002 |
| JP | 2002-343766 A |  | 11/2002 |
| JP | 2006-108127 | * | 4/2006 |

OTHER PUBLICATIONS

The First Office Action for Application No. 2007101437097 from The State Intellectual Property Office of the People's Republic of China dated Dec. 25, 2009.

* cited by examiner

*Primary Examiner*—George R Koch, III
(74) *Attorney, Agent, or Firm*—Cheng Law Group, PLLC

(57) ABSTRACT

A grinding unit grinds an annular convex portion formed at an outer periphery of a back face of a wafer such that the wafer has a uniform thickness. After such process, a robot arm of a transport unit transports the wafer to an inspection unit for inspecting occurrence of damage at the wafer. Then, the robot arm transports the wafer without damage to a mount frame preparation unit. Herein, the wafer is joined to a ring frame through a dicing tape, and then a protective tape is separated from a front face of the wafer. Thus, a mount frame is prepared.

9 Claims, 14 Drawing Sheets

SEMICONDUCTOR WAFER MOUNT APPARATUS

BACKGROUND OF THE INVENTION (1) Field of the Invention

The present invention relates to a semiconductor wafer mount apparatus for joining a semiconductor wafer, which has been subjected to a back grinding process, to a ring frame through a supporting adhesive tape (dicing tape) such that the ring frame supports the semiconductor wafer, thereby manufacturing a mount frame.

(2) Description of the Related Art

Semiconductor chips are obtained from a semiconductor wafer (hereinafter, simply referred to as "wafer") through the following steps: a step of joining the wafer to a supporting adhesive tape joined to a ring frame such that the ring frame supports the wafer; a step of separating a protective tape joined to a front face of the wafer; and a step of subjecting a dicing process to the wafer so as to divide the wafer into the semiconductor chips (refer to, for example, JP-A 2002-343766).

Recently, a wafer is made thinner in response to needs for size reduction and high-density package as to an electronic device. However, a wafer made thin so as to have a thickness of several tens of micrometers becomes cracked or chipped readily due to an influence of warpage or local stress. Consequently, there is a high possibility that such wafer is damaged in a back grinding process where a working external force is acted on the wafer. In particular, the wafer, which has been made thin in the back grinding process, is readily susceptible to damage in handling. In order to avoid such disadvantage, there is the following proposition. That is, a center of a wafer is ground in a back grinding process to form an annular convex portion at an outer periphery of the wafer; thus, the wafer is allowed to have rigidity. In other words, the wafer is processed so as to be less susceptible to damage in handling.

In a case that semiconductor chips are obtained from the wafer, further, the wafer is joined to a ring frame through a supporting adhesive tape in order to prevent the semiconductor chips from being scattered and to reinforce the wafer. However, there is a problem that the ring frame cannot support the wafer with good accuracy due to presence of the annular convex portion.

SUMMARY OF THE INVENTION

The present invention is devised in view of the aforementioned circumstances. An object of the present invention is to provide a semiconductor wafer mount apparatus capable of removing an annular convex portion from a wafer to make the wafer thin, and joining the wafer, which has been subjected to a back grinding process without damage, to a ring frame through a supporting adhesive tape with good accuracy, even when the wafer is made thin.

In order to accomplish this object, the present invention adopts the following configuration:

A semiconductor wafer mount apparatus for manufacturing a mount frame including: a semiconductor wafer having a front face to which a protective tape is joined and a back face on which an annular convex portion is formed at an outer periphery of the back face so as to surround a flat concave portion formed by back grinding; and a ring frame supporting the semiconductor wafer through a supporting adhesive tape, the semiconductor wafer mount apparatus comprising: a grinding unit for removing the annular convex portion formed at the outer periphery of the back face of the semiconductor wafer such that the semiconductor wafer has a uniform thickness; a transport unit for allowing a robot arm to take the semiconductor wafer, from which the annular convex portion has been removed, and to transport the semiconductor wafer to a subsequent step; and a mount frame preparation unit for joining the semiconductor wafer transported by the robot arm to the ring frame through the adhesive tape to prepare the mount frame, wherein the mount frame preparation unit includes: an alignment stage for holding the semiconductor wafer placed thereon by the robot arm such that the front face of the semiconductor wafer, to which the protective tape is joined, is directed upward; joining means for transporting the semiconductor wafer subjected to alignment in the alignment stage to a joining section, and joining the semiconductor wafer to a adhesive surface of the adhesive tape joined to the ring frame; and a protective tape separation mechanism for separating the protective tape from the front face of the semiconductor wafer in the prepared mount frame.

A semiconductor wafer subjected to a back grinding process is reinforced with an annular convex portion left on an outer periphery thereof when the semiconductor wafer is made thin. Therefore, the semiconductor wafer mount apparatus according to the present invention can treat with the semiconductor wafer with high rigidity.

When the semiconductor wafer is transported to the semiconductor wafer mount apparatus in the aforementioned state, the grinding unit grinds the annular convex portion left on the outer periphery of the back face of the semiconductor wafer such that the semiconductor wafer has a uniform thickness. After the removal of the annular convex portion, the robot arm of the transport unit transports the semiconductor wafer to the mount frame preparation unit. Herein, the semiconductor wafer is placed on the alignment stage in a state that a front face of the semiconductor wafer, to which a protective tape is joined, is directed upward. The semiconductor wafer is subjected to alignment in the alignment stage, and then is transported to the joining section. Herein, the semiconductor wafer is joined to a adhesive surface of a adhesive tape joined to a ring frame; thus, a mount frame is prepared. The prepared mount frame is transported to the protective tape separation mechanism. Herein, the protective tape is separated from the front face of the semiconductor wafer in the mount frame. After completion of the separation, the mount frame is ready for a dicing process.

That is, the semiconductor wafer mount apparatus according to the present invention can perform a series of processes from removal of an annular convex portion for enhancing rigidity of a semiconductor wafer to preparation of a mount frame.

In the semiconductor wafer mount apparatus according to the present invention, the grinding unit includes a wafer supply section including a cassette housing a stack of semiconductor wafers each having an annular convex portion left on an outer periphery of a back face thereof.

With this configuration, a rigid semiconductor wafer reinforced with an annular convex portion left on an outer periphery thereof is housed in the cassette in a stacked manner without occurrence of warpage due to a self weight. Therefore, the robot arm can readily take such semiconductor wafer out of the cassette with certainty.

In the semiconductor wafer mount apparatus according to the present invention, preferably, the transport unit includes: an inspection unit for inspecting whether or not damage occurs at the outer periphery of the semiconductor wafer which has been subjected to the removal of the annular convex portion; and a defective collection section for collecting the semiconductor wafer detected as a defective.

With this configuration, as for semiconductor wafers from which annular convex portions have been removed, good wafers and defective wafers are sorted out prior to transport to the mount frame preparation unit. Accordingly, only a semiconductor wafer without damage on an outer periphery thereof is transported to the mount frame preparation unit.

In the semiconductor wafer mount apparatus according to the present invention, preferably, the mount frame preparation unit includes a tape processing section for joining a strip-shaped supporting adhesive tape to a bottom side of a ring frame taken out of a ring frame supply section, and cutting the adhesive tape along the ring frame.

With this configuration, supply of a semiconductor wafer from which an annular convex portion has been removed and joining of a adhesive tape to a ring frame are performed simultaneously. This brings high processability as compared with a case that a adhesive tape is joined to a ring frame in a previous step, and then the ring frame is subjected to a joining process.

In the semiconductor wafer mount apparatus according to the present invention, preferably, the tape processing section includes: a cutter blade for cutting the adhesive tape while turning along the ring frame; and a plurality of pressing rollers each rolling on the ring frame in synchronization with a cutting operation of the cutter blade to press the adhesive tape against the ring frame.

With this configuration, the joining rollers substantially evenly support a ring frame at plural points; therefore, the cutter blade can travel stably. In addition, the joining rollers press a portion of the adhesive tape cut by the cutter blade, leading to avoidance of joining failure.

Preferably, the semiconductor wafer mount apparatus further comprises a mechanism for pulling the adhesive tape in a width direction when the adhesive tape is cut.

With this configuration, a adhesive tape can be joined to a ring frame without occurrence of wrinkles.

Preferably, the semiconductor wafer mount apparatus according to the present invention further comprises a transport chuck for transporting the semiconductor wafer, which has been subjected to the alignment in the alignment stage, to the joining section.

In the semiconductor wafer mount apparatus according to the present invention, preferably, the robot arm suction holds the back face of the semiconductor wafer from which the annular convex portion has been removed by the grinding unit, the robot arm turns the semiconductor wafer upside down, brings the back face of the semiconductor wafer into contact with the alignment stage such that alignment stage suction holds the back face of the semiconductor wafer, and releases the suction of the semiconductor wafer, the alignment stage performs alignment on the semiconductor wafer, brings the front face of the semiconductor wafer into contact with the transport chuck while suction holding the back face of the semiconductor wafer such that the transport chuck suction holds the front face of the semiconductor wafer, and releases the suction of the semiconductor wafer, the transport chuck transports the semiconductor wafer to the joining section while suction holding the front face of the semiconductor wafer, and allows the back face of the semiconductor wafer to approach the adhesive surface of the adhesive tape joined to the ring frame, the joining roller rolls on a non-adhesive surface of the adhesive tape in a state that the transport chuck suction holds the front face of the semiconductor wafer, and joins the adhesive tape to the back face of the semiconductor wafer, and the transport chuck releases the suction of the semiconductor wafer.

With this configuration, a semiconductor wafer, which has been subjected to back grinding, can be joined to a ring frame while being corrected so as to be flat. Therefore, no warpage occurs at the semiconductor wafer.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENT

Hereinafter, description will be given of a semiconductor wafer mount apparatus according to an embodiment of the present invention with reference to the drawings.

Figure 14:
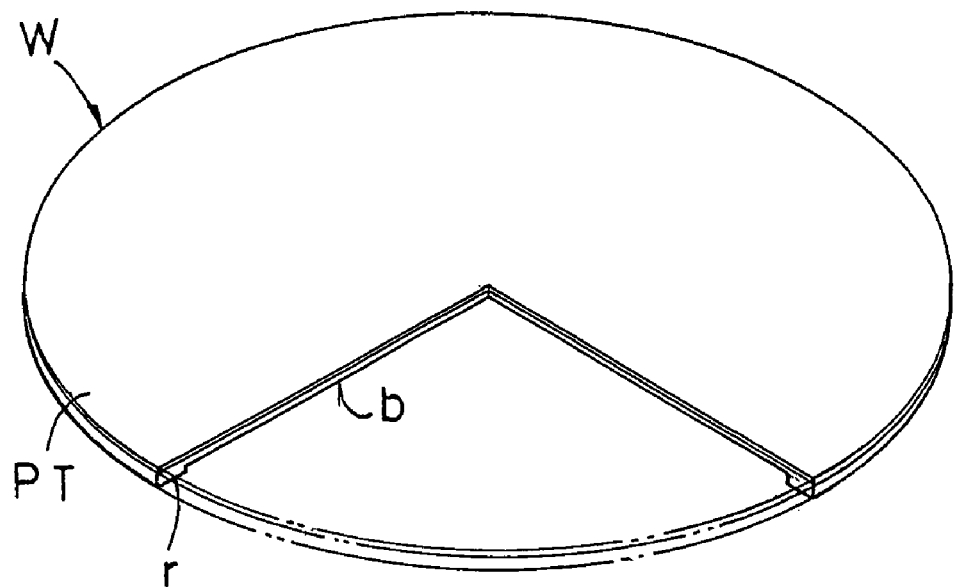
FIG. 14 is a perspective view illustrating a front face of a semiconductor wafer which is not subjected to grinding yet.
Figure 15:
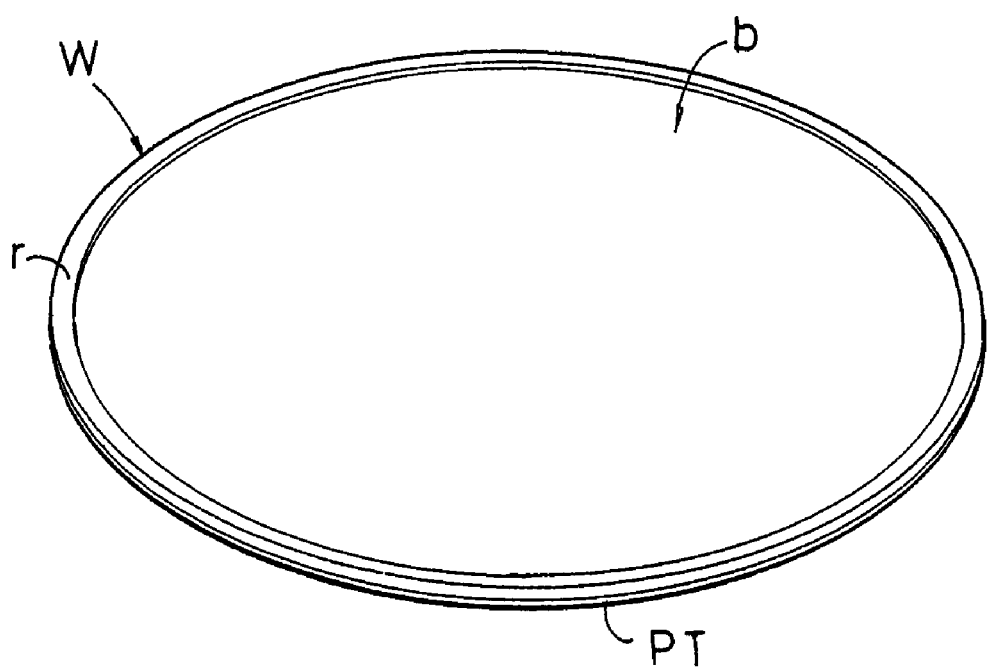
FIG. 15 is a perspective view illustrating a back face of the semiconductor wafer which is not subjected to grinding yet.
Figure 16:
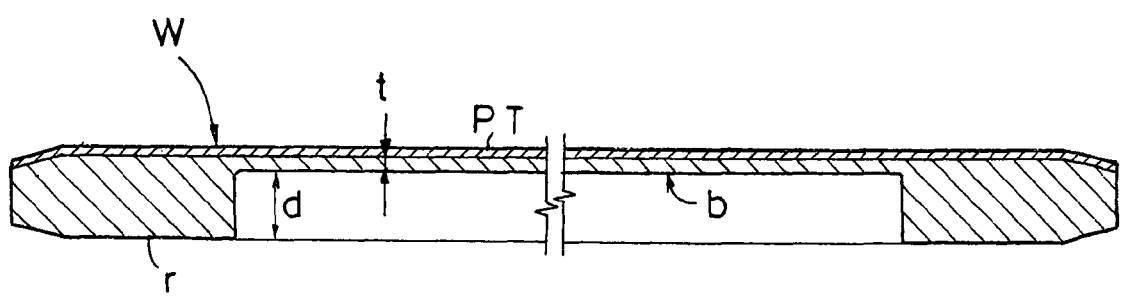
FIG. 16 is a vertical sectional view illustrating the semiconductor wafer which is not subjected to grinding yet.

FIG. 14 is a partially-cutout perspective view illustrating a front face of a wafer which is a subject to be processed in the present invention. FIG. 15 is a perspective view illustrating a back face of the wafer in FIG. 14. FIG. 16 is a vertical sectional view illustrating the wafer in FIG. 14.

As illustrated in FIGS. 14 and 15, the wafer W is subjected to a back grinding process so as to have a predetermined thickness in a state that a protective tape PT is joined to the front face (the face on which a pattern is formed) of the wafer W in order to protect the front face. The back face of the wafer W is ground (back grinding) such that an outer peripheral portion is higher than a ground portion by about 2 mm in a radial direction. More specifically, a circular flat concave portion b is formed on the substantially entire area of the back face and an annular convex portion r is left along the outer periphery of the back face. Herein, the flat concave portion b has a depth d of several hundreds of micrometers and a thickness t of several tens of micrometers. That is, the annular convex portion r formed at the outer periphery of the back face functions as an annular rib for enhancing rigidity of the wafer W. Accordingly, the annular convex portion r hinders the wafer W from being bent or warped in handling or another processing.

Figure 13:
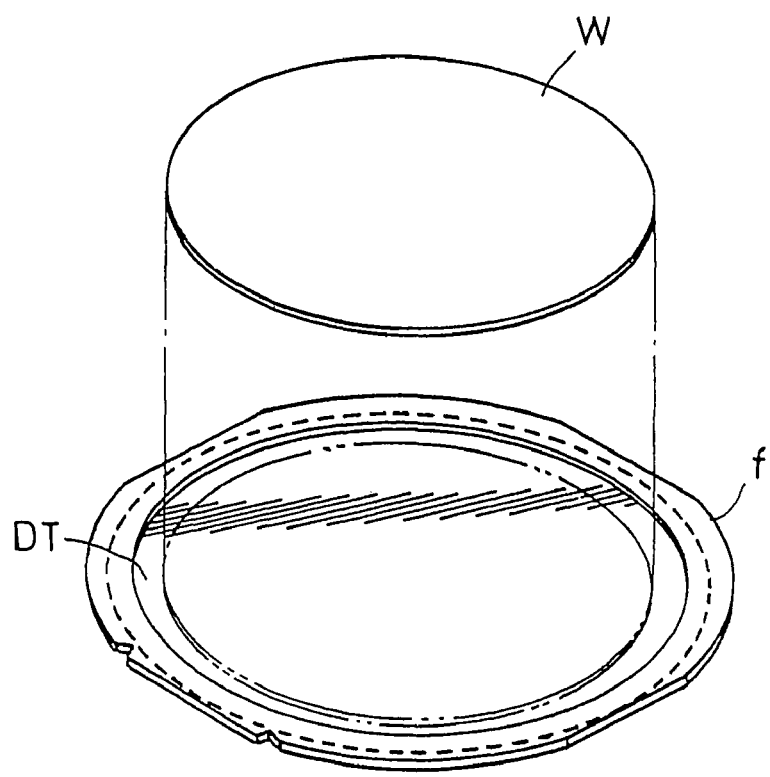
FIG. 13 is a perspective view illustrating a mount frame.

The aforementioned wafer W is subjected to a process for removing the annular convex portion r so as to have a uniform thickness, as a previous step of a dicing process. Thereafter, the back face of the wafer W having a uniform thickness is joined to a adhesive surface of a supporting adhesive tape (hereinafter, appropriately referred to as "dicing tape") DT joined to a ring frame f as illustrated in FIG. 13; thus, a mount frame MF is prepared. The mount frame MF is transported to the dicing process.

Figure 1:
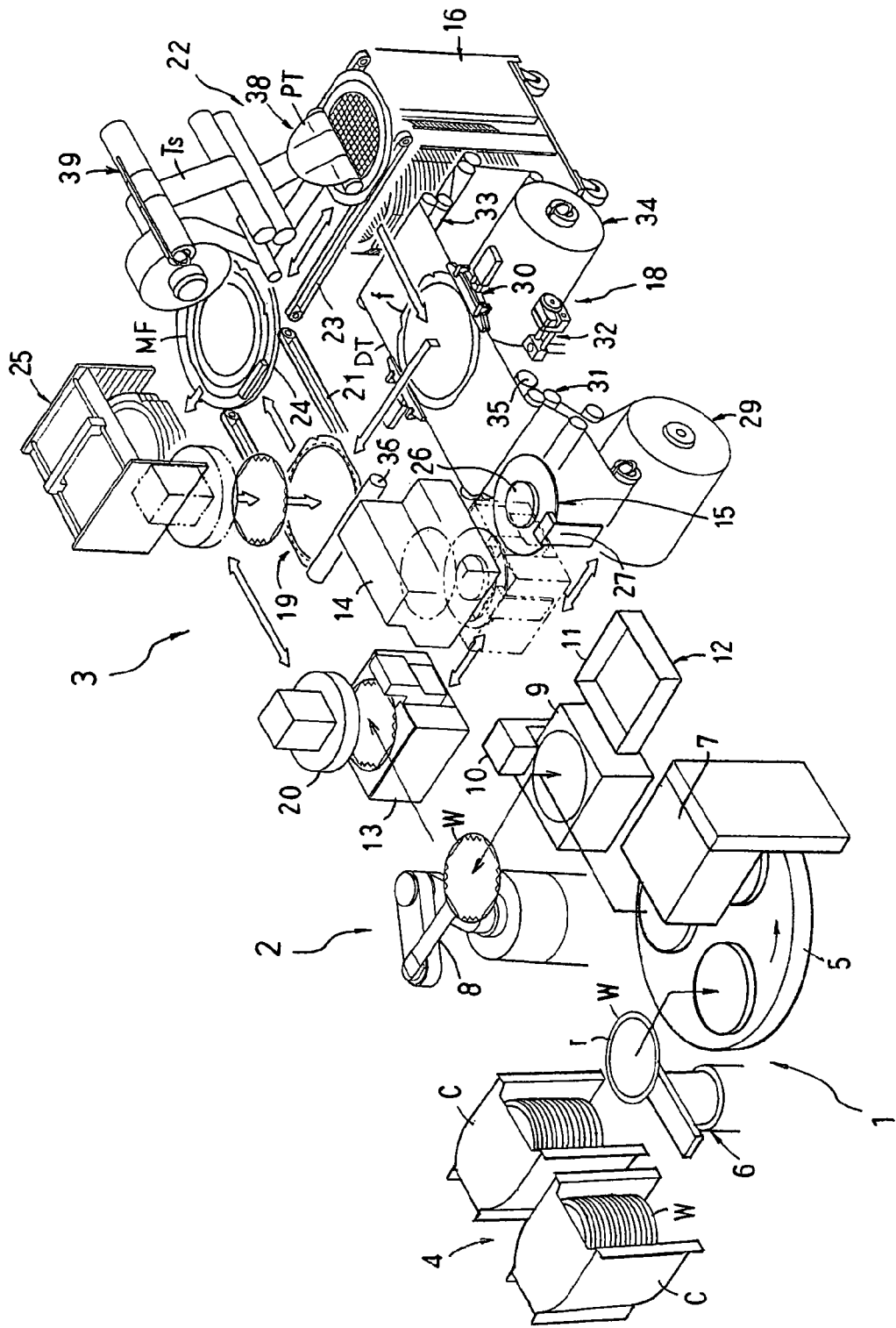
FIG. 1 is a perspective view illustrating a general configuration of a semiconductor wafer mount apparatus.
Figure 2:
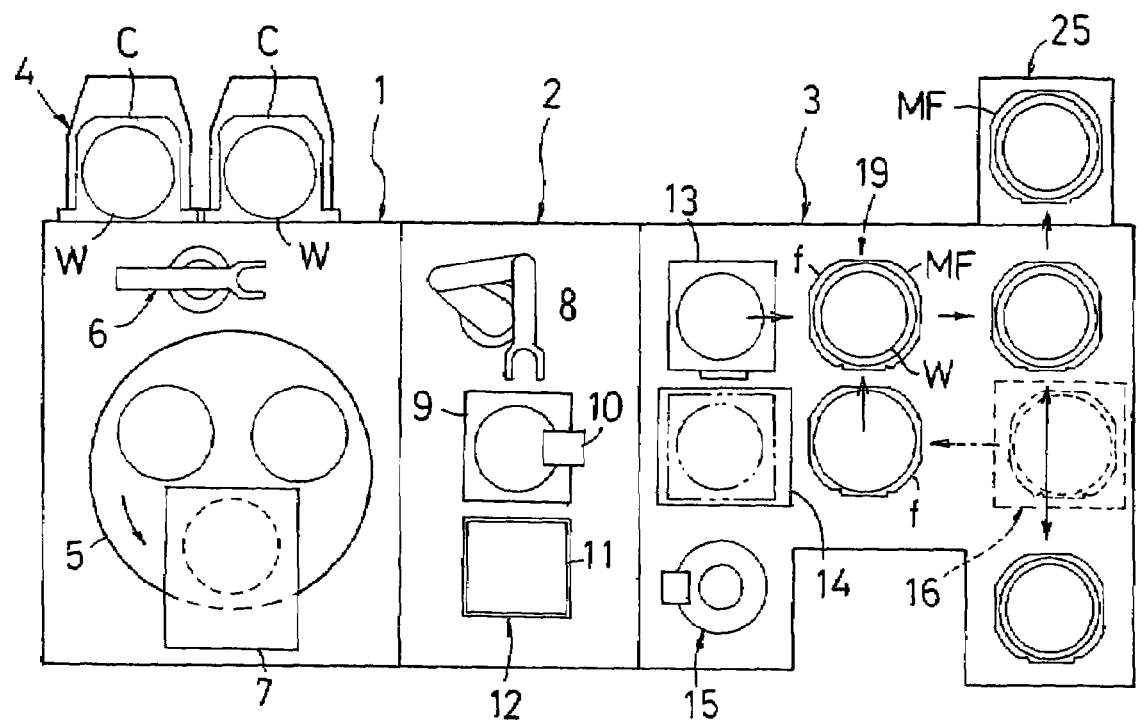
FIG. 2 is a plan view illustrating a layout of the semiconductor wafer mount apparatus.

FIGS. 1 and 2 illustrate a semiconductor wafer mount apparatus adopting an in-line system of processes from preparation of a mount frame MF to separation of a protective tape PT from a front face of a wafer W in the mount frame MF. In the preparation of the mount frame MF, the semiconductor wafer mount apparatus removes an annular convex portion r from the wafer W which is transported thereto in a state that the annular convex portion r is left on a back face of the wafer W in a back grinding process.

The semiconductor wafer mount apparatus includes a grinding unit 1, a transport unit 2 and a mount frame preparation unit 3 which are arranged in a coupled manner. The grinding unit 1 grinds an annular convex portion r to remove the annular convex portion r from a back face of a wafer W. The transport unit 2 takes the wafer W which has been subjected to grinding, and then transports the wafer W to a subsequent step. The mount frame preparation unit 3 performs preparation of a mount frame MF and separation of a protective tape PT from a front face of the wafer W.

The grinding unit 1 includes a wafer supply section 4, a turn table 5, a transport robot 6, a grinding mechanism 7 and the like. The wafer supply section 4 includes a cassette C housing a stack of wafers W each of which has been subjected to a back grinding process with an annular convex portion r left thereon. The turn table 5 suction holds a wafer W in a state that a back face of the wafer W is directed upward. The transport robot 6 takes wafers W one by one out of the cassette C, and then transports the wafers W to the turn table 5. The grinding mechanism 7 grinds a back face of a wafer W, which is directed upward while being suction held by the turn table 5, to remove an annular convex portion r from the back face of the wafer W, and washes the ground face.

The transport unit 2 includes a robot arm 8, an inspection unit 10 and a defective collection section 12. The robot arm 8 suction holds a wafer W, which has been subjected to grinding, to take the wafer W out of the grinding unit 1, and turns the wafer W upside down. The inspection unit 10 optically inspects whether or not damage occurs at an outer periphery of a wafer W placed on and held by the chuck table 9. The defective collection section 12 includes a tray 11 for collecting a defective suffering damage.

The mount frame preparation unit 3 includes an alignment stage 13, an ultraviolet-ray irradiation unit 14, a detection unit 15, a ring frame supply section 16, a ring frame transport mechanism 17 (see FIGS. 3 to 5), a tape processing section 18, a joining section 19, a transport chuck 20, a first mount frame transport mechanism 21, a protective tape separation mechanism 22, a second mount frame transport mechanism 23, a turn table 24, a mount frame collection section 25 and the like. The alignment stage 13 has a wafer W placed thereon by the robot arm 8, and is movable horizontally. The ultraviolet-ray irradiation unit 14 irradiates a front face of a wafer W placed on the alignment stage 13 with ultraviolet rays. The detection unit 15 detects a detection site such as a notch formed at an outer periphery of a wafer W placed on the alignment stage 13. The ring frame supply section 16 houses a stack of ring frames f. The ring frame transport mechanism 17 transports a ring frame f to a dicing tape joining position. The tape processing section 18 joins a dicing tape DT to a bottom side of a ring frame f. The joining section 19 integrally joins a wafer W to a ring frame f to which a dicing tape DT is joined, thereby preparing a mount frame MF. The transport chuck 20 suction holds a back face of a wafer W placed on the alignment stage 13, and then transports the wafer W to the mount frame preparation section 19. The first mount frame transport mechanism 21 performs transport of a prepared mount frame MF. The protective tape separation mechanism 22 performs separation of a protective tape PT joined to a front face of a wafer W. The second mount frame transport mechanism 23 transports a mount frame MF from which a protective tape PT has been removed by the protective tape separation mechanism 22. The turn table 24 performs turning and transport of a mount frame MF. The mount frame collection section 25 collects mount frames MF in a stacked manner.

The alignment stage 13 is movable from an initial position where the alignment stage 13 receives a wafer W to a position located below the ultraviolet-ray irradiation unit 14 while suction holding a wafer W. Further, the alignment stage 13 performs alignment on a wafer W on the basis of information about detection by the detection unit 15.

The ultraviolet-ray irradiation unit 14 irradiates a protective tape PT, for example, an ultraviolet-ray curable adhesive tape, which is joined to a front face of a wafer W, with ultraviolet rays to lower adhesion of the protective tape PT.

The detection unit 15 is movable from a standby position to a position located below the ultraviolet-ray irradiation unit 14. In addition, the detection unit 15 has the following configuration. That is, an outer peripheral edge of a wafer W placed on the alignment stage 13 is highlighted with light emitted from a light source 26 using an LED, and then a monitoring sensor 27 such as a CCD camera detects a detection site such as a notch formed at the outer periphery of the wafer W.

The ring frame supply section 16 is formed into a wagon provided with casters and, therefore, can be manually carried in/carried out of a main body of the semiconductor wafer mount apparatus. Moreover, a stack of ring frames f housed in the ring frame supply section 16 are moved upward at a regular pitch, and the uppermost one of them is successively taken out of the ring frame supply section 16.

The tape processing section 18 includes a tape supply section 29, tension application mechanisms 30, a joining unit 31, a tape cutting mechanism 32, a separation unit 33 and a tape collection unit 34. The tape supply section 29 unreels a dicing tape DT from an original tape roll. Each tension application mechanism 30 applies an appropriate tension to a dicing tape DT. The joining unit 31 joins a dicing tape DT to a ring frame f. The tape cutting mechanism 32 cuts a dicing tape DT joined to a ring frame f along a contour of the ring frame f. The separation unit 33 separates an unnecessary portion of a dicing tape DT cut by the tape cutting mechanism 32 from a ring frame f. The tape collection section 34 reels and collects an unnecessary portion of a cut dicing tape DT.

As will be described later, the tension application mechanisms 30 grasp both end sides of a dicing tape DT in a width direction, respectively, and apply an appropriate tension to the dicing tape DT by pulling the dicing tape DT in the width direction.

The joining unit 31 is situated at a standby position located obliquely below a ring frame f held above a dicing tape DT (an obliquely lower left portion in FIG. 1). The joining unit 31 includes a joining roller 35. When the tape supply section 29 starts to supply the dicing tape DT, the joining roller 35 moves toward a joining start position (a right side in the figure) in a tape supplying direction.

After arrival at the joining start position, the joining roller 35 moves upward to join the dicing tape DT to a bottom side of the ring frame f directed downward while pressing the dicing tape DT against the bottom side of the ring frame f. Thereafter, the joining roller 35 moves from the joining start position toward the standby position while rolling on the dicing tape DT. Thus, the dicing tape DT is joined to the bottom side of the ring frame f directed downward while being pressed against the bottom side of the ring frame f.

As will be described later, the separation unit 33 separates an unnecessary portion of a dicing tape DT cut by the tape cutting mechanism 32 from a ring frame f.

The tape cutting mechanism 32 is situated below a dicing tape DT on which a ring frame f is placed. When the joining unit 31 joins the dicing tape DT to a bottom side of the ring frame f directed downward, the tape cutting mechanism 32 moves upward. Then, the tape cutting mechanism 32 cuts the dicing tape DT along a circular contour of the ring frame f.

The joining section 19 includes a joining roller 36 having an elastically-deformable circumferential face. The joining roller 36 rolls on a non-adhesion surface (bottom surface) of a dicing tape DT joined to a bottom side of a ring frame f directed downward while pressing the dicing tape DT against the ring frame f.

The first mount frame transport mechanism 21 transfers a mount frame MF formed by integration of a ring frame f and a wafer W to a separation table (not illustrated) of the protective tape separation mechanism 22.

The protective tape separation mechanism 22 includes the separation table (not illustrated), a tape supply section 37, a separation unit 38, a tape collection section 39 and the like. The separation table moves a wafer W placed thereon. The tape supply section 37 supplies a separating adhesive tape Ts unreeled from an original tape roll. The separation unit 38 performs joining and separation of a separating adhesive tape Ts. The tape collection section 39 reels and collects a separating adhesive tape Ts together with a protective tape PT.

The second mount frame transport mechanism 23 transfers a mount frame MF discharged from the protective tape separation mechanism 22 to the turn table 24.

The turn table 24 performs alignment on a mount frame MF, and allows the mount frame collection section 25 to house the mount frame MF. Specifically, when the second mount frame transport mechanism 23 places a mount frame MF on the turn table 24, the turn table 24 performs alignment on the mount frame MF on the basis of a detection site such as a 'V'-shaped notch of a wafer W or a position of a ring frame f. The turn table 24 turns around to change a direction that the mount frame MF is housed in the mount frame collection section 25. After determination of the housing direction, further, the turn table 24 allows a pusher (not illustrated) to push out the mount frame MF toward the mount frame collection section 25. Thus, the mount frame MF is housed in the mount frame collection section 25.

The mount frame collection section 25 is placed on a liftable placement table (not illustrated). When the placement table moves upward/downward, the mount frame MF pushed by the pusher can be housed in any stage of the mount frame collection section 25.

Figure 3:
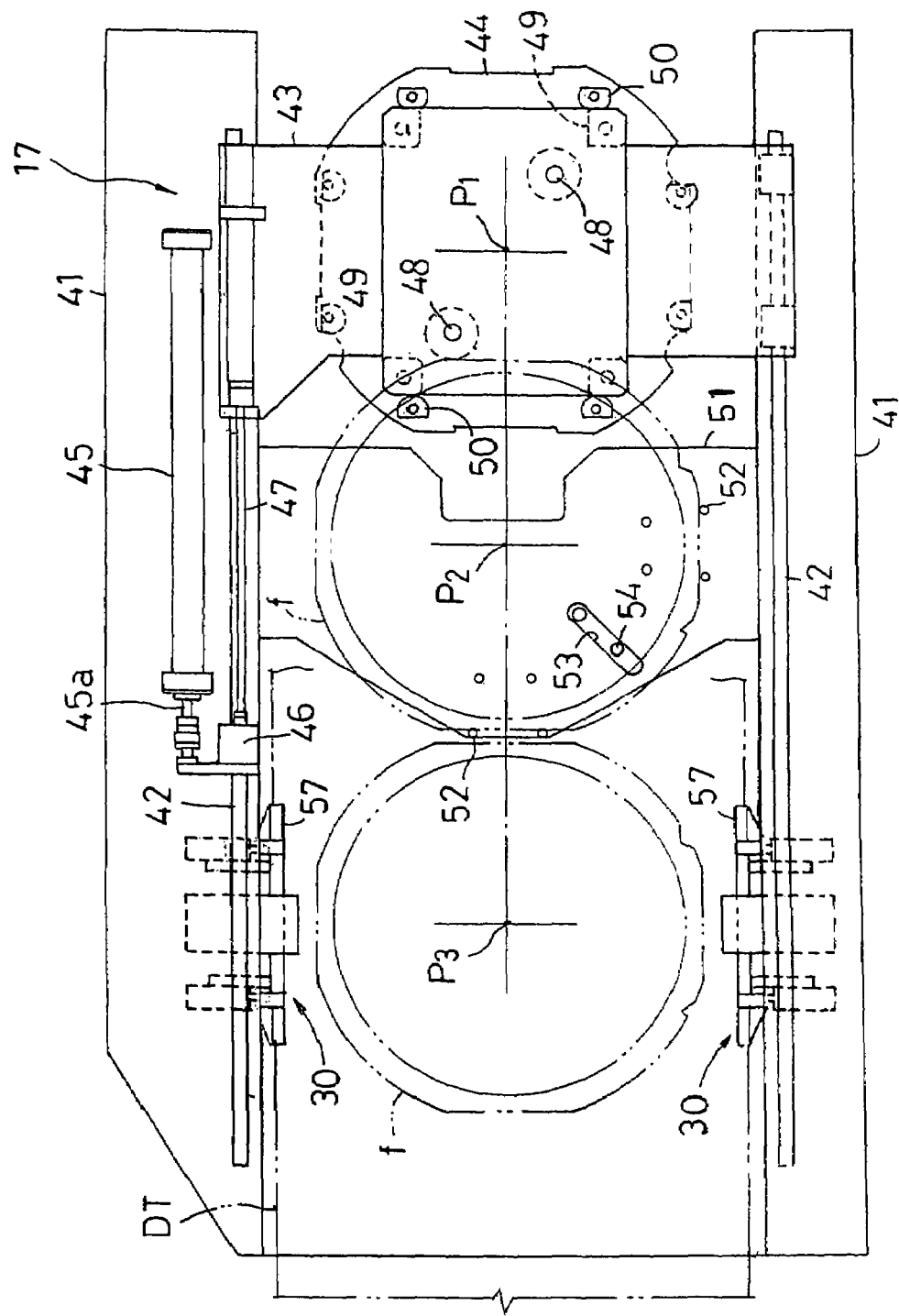
FIG. 3 is a plan view illustrating a ring frame transport mechanism and a tension application mechanism.
Figure 4:
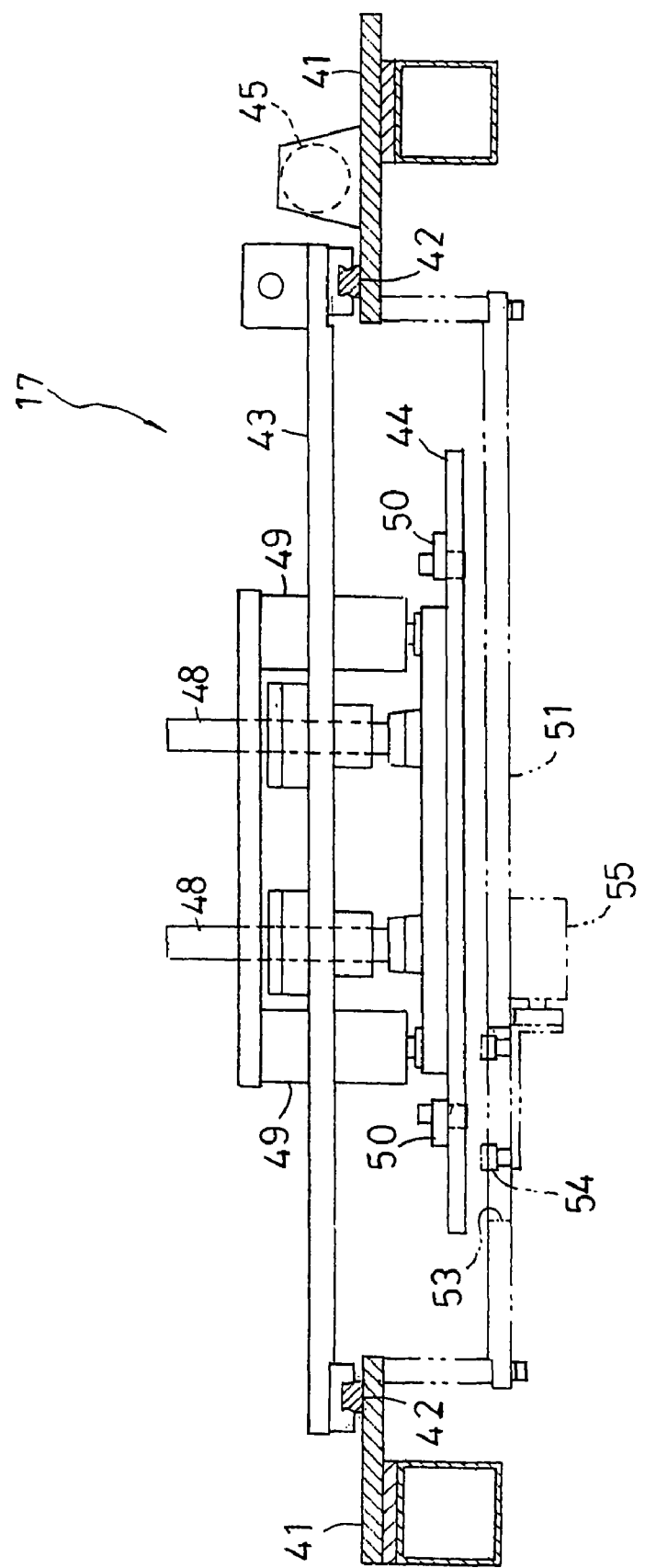
FIG. 4 is a front view illustrating the ring frame transport mechanism.
Figure 5:
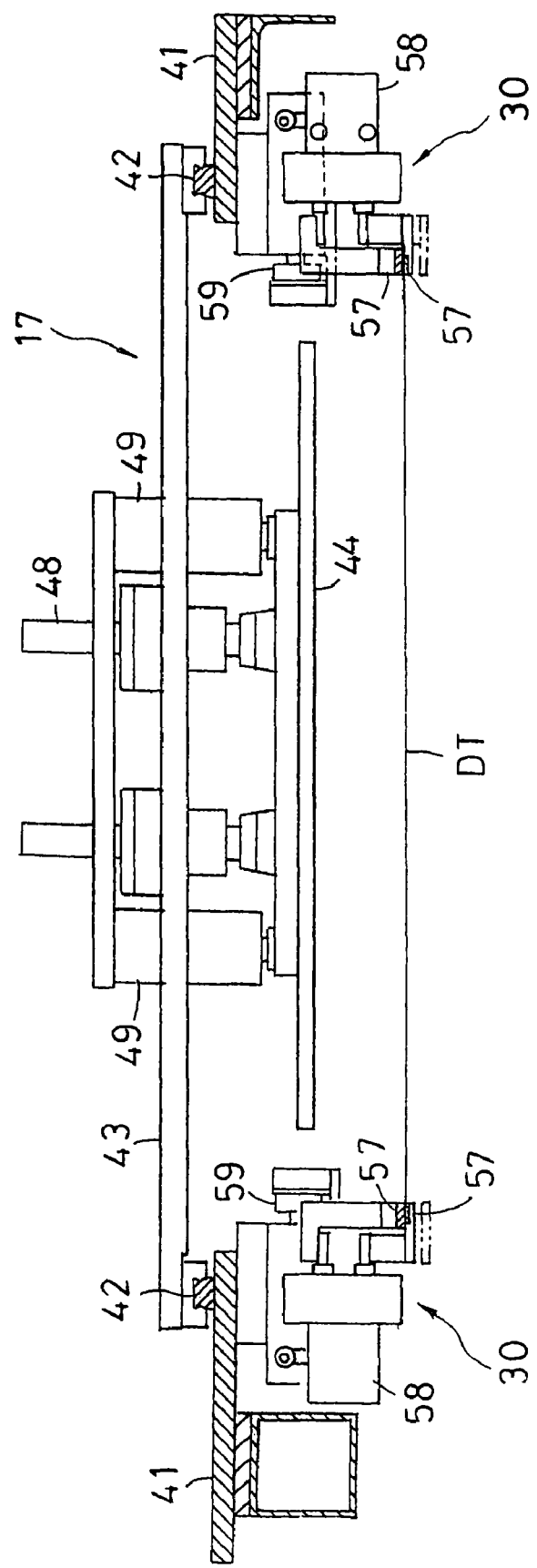
FIG. 5 is a front view illustrating the tension application mechanism.

Next, FIGS. 3 to 5 illustrate detailed structures of the ring frame transport mechanism 17 and the tension application mechanism 30.

The ring frame transport mechanism 17 includes a pair of bases 41, a movable frame 43, a lift plate 44 and the like. The pair of bases 41 are disposed in parallel with a predetermined clearance interposed therebetween. The movable frame 43 is horizontally movable forward/rearward along a rail 42 provided on each base 41. The lift plate 44 is disposed below the movable frame 43 and is vertically movable.

An air cylinder 45 is disposed above one of the pair of bases 41. A pushing/pulling rod 47 couples between a movable block 46 coupled to a piston rod 45a of the air cylinder 45 and the movable frame 43. Specifically, by expansion/compression of the air cylinder 45, the movable frame 43 moves from a ring frame taking position P1 to a tape joining position P3 each corresponding to a center of the ring frame supply section 16.

The lift plate 44 is supported by the movable frame 43 through a pair of guide shafts 48 so as to be horizontally movable, and is driven by four air cylinders 49 so as to be vertically movable. Further, suction heads 50 are attached to appropriate places in the vicinity of an outer periphery of the lift plate 44 so as to be bared at a bottom face of the lift plate 44. These suction heads 50 suction hold a top side of the ring frame f.

As illustrated in FIG. 3, an alignment stage 51 for connecting between the pair of bases 41 is provided at an intermediate position between the ring frame taking position P1 and the tape joining position P3. Two pairs of positioning pins 52 are provided on a top face of the alignment stage 51 so as to receive orthogonal two linear edges formed on the outer periphery of the ring frame f. In addition, an operating pin 54 protrudes from the top face of the alignment stage 51 so as to be movable along an inclined long hole 53. Specifically, a ring frame f supplied onto and placed on the alignment stage 51 is locked with the operating pin 54 driven by an air cylinder 55 illustrated in FIGS. 4 and 5, and is received and supported by the two pairs of positioning pins 52. Thus, the ring frame f is positioned at a predetermined position P2.

As illustrated in FIG. 3, the tension application mechanisms 30 are disposed beside the tape joining position P3, respectively. Each tension application mechanism 30 includes a pair of upper and lower chuck claws 57 grasping both end sides of a dicing tape DT, which is supplied onto the tape joining position P3, in a width direction. As illustrated in FIG. 5, the upper and lower chuck claws 57 are attached to an open/close actuator 58 driven by air. Thus, the upper and lower chuck claws 57 are open or close vertically so as to approach each other or move away from each other. Herein, each chuck claw 57 has a tip end provided with a rubber piece which allows each chuck claw 57 to grasp a dicing tape DT without a slip.

The open/close actuator 58 including the chuck claws 57 advances/retreats in a tape width direction while being coupled to an air cylinder 59 fixedly disposed below the base 41. Specifically, the open/close actuators 58 are actuated by an elastic force of a spring of the air cylinder 59 or a weak air pressure while grasping the both end sides of the dicing tape DT in the width direction; thus, the dicing tape DT receives an appropriate tension and is pulled in the width direction.

Figure 6:
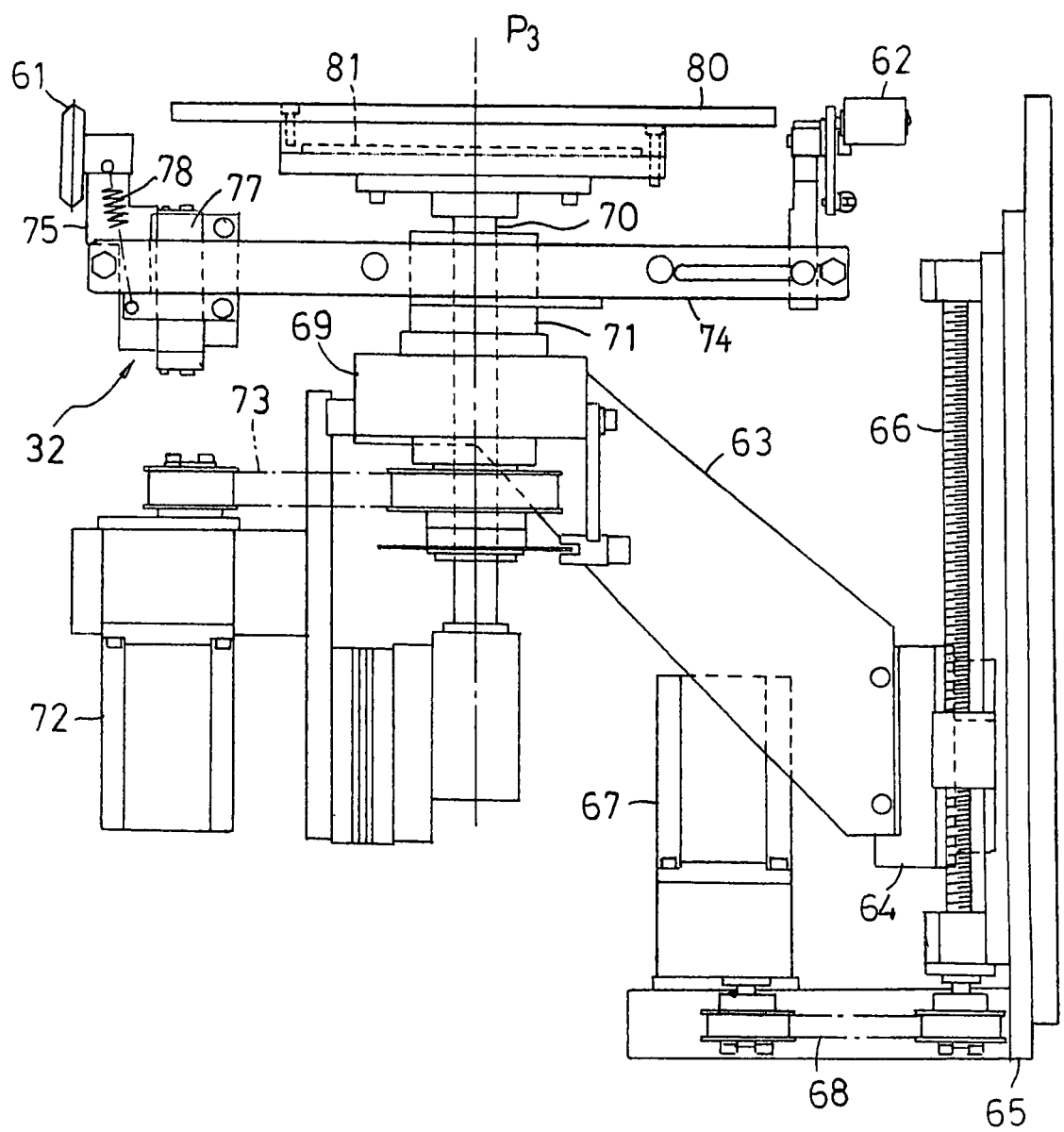
FIG. 6 is a front view illustrating a tape cutting mechanism.
Figure 7:
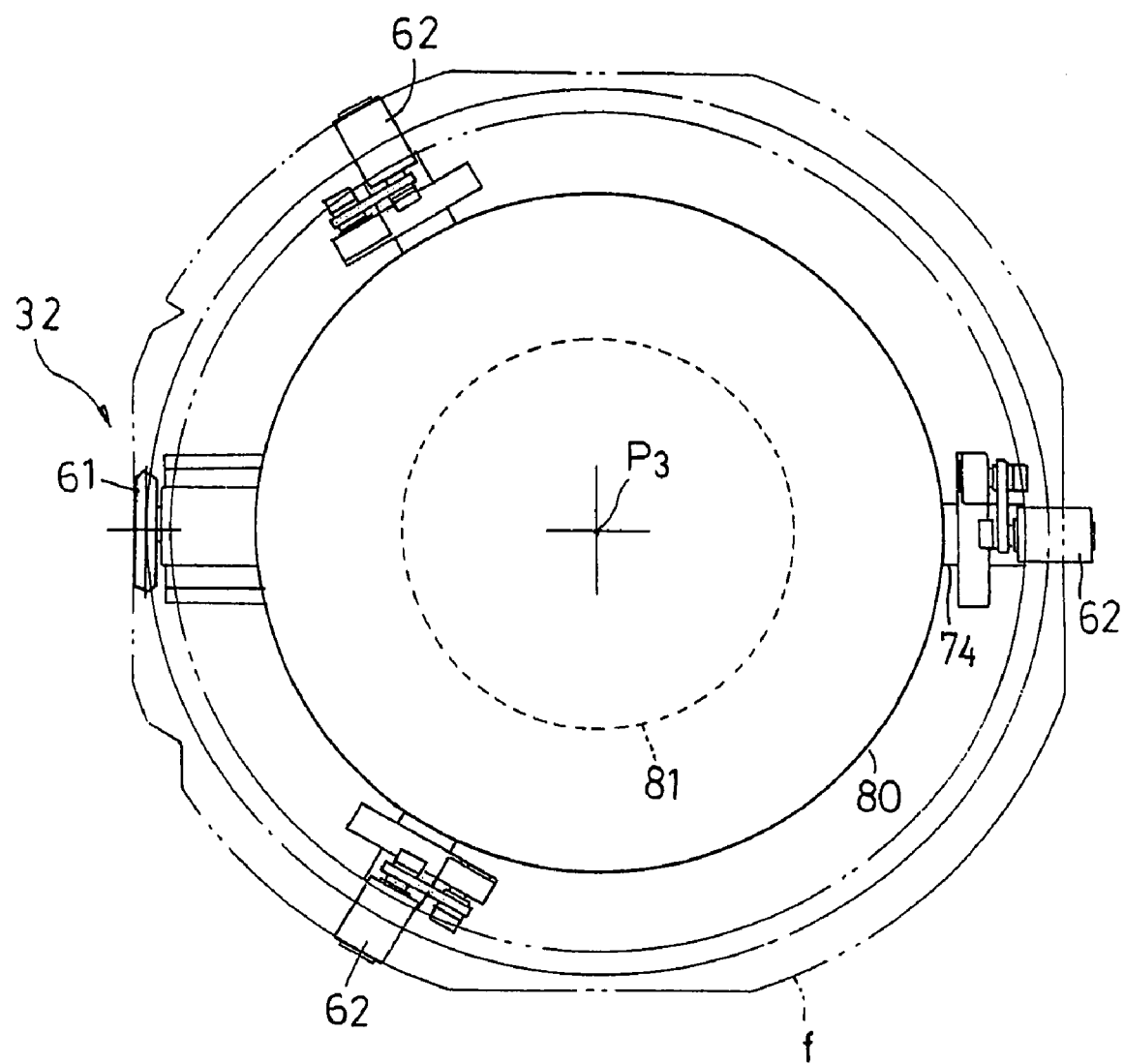
FIG. 7 is a plan view illustrating the tape cutting mechanism.

FIGS. 6 and 7 illustrate a detailed structure of the tape cutting mechanism 32.

The tape cutting mechanism 32 is disposed immediately below the tape joining position P3, and includes a disc-shaped cutter 61, three pressing rollers 62 and a movable frame 63. The disc-shaped cutter 61 is disposed at a predetermined distance from the tape joining position P3. The three pressing rollers 62 are disposed at regular pitches in a circumferential direction with the tape joining position P3 regarded as a center. The movable frame 63 allows the cutter 61 and each pressing roller 62 to vertically move.

The movable frame 63 is coupled to a movable block 64 moved upward/downward by a screw. The movable block 64 is engaged with a screw shaft 66 provided upright on a fixed bench 65. The screw shaft 66 is interlocked with an electric motor 67 with a speed reducer in such a manner that a toothed belt 68 is wound around the screw shaft 66 and the electric motor 67 without a slip.

The movable frame 63 has a tip end provided with a bearing boss part 69 which is concentric with the tape joining position P3. A fixed support shaft 70 penetrates through a center of the bearing boss part 69, and a center boss 71 is rotatably attached to the bearing boss part 69. The center boss 71 has a lower end interlocked with an electric motor 72 with a speed reducer in such a manner that a toothed belt 73 is wound around the center boss 71 and the electric motor 72.

Support arms 74 are radially coupled to an upper end of the center boss 71. A cutter bracket 75 which horizontally and pivotally support a cutter 61 is attached to a tip end of one of the support arms 74 so as to be movable vertically. A pressing roller 62 is attached to a tip end of another support arm 74 so as to be movable vertically through a oscillation arm 76. The cutter bracket 75 is moved upward by an air cylinder 77 and is moved downward by a spring 78.

A heat radiation plate 80 is attached to an upper end of the fixed support shaft 70 penetrating through the center of the bearing boss part 69. The heat radiation plate 80 is formed into a disc shape which is smaller in diameter than an inner diameter of a ring frame f. A heater 81 is incorporated in the heat radiation plate 80.

Next, description will be schematically given of a series of operations performed by the aforementioned semiconductor wafer mount apparatus according to this embodiment.

The wafer supply section 4 of the grinding unit 1 includes the cassette C housing a stack of wafers W in a state that a front face of each wafer W, which is protected by a protective tape PT, is directed downward. The robot arm 8 takes the wafers W one by one out of the cassette C, and then transfers the wafer W onto a predetermined position of the turn table 5.

Figure 17:
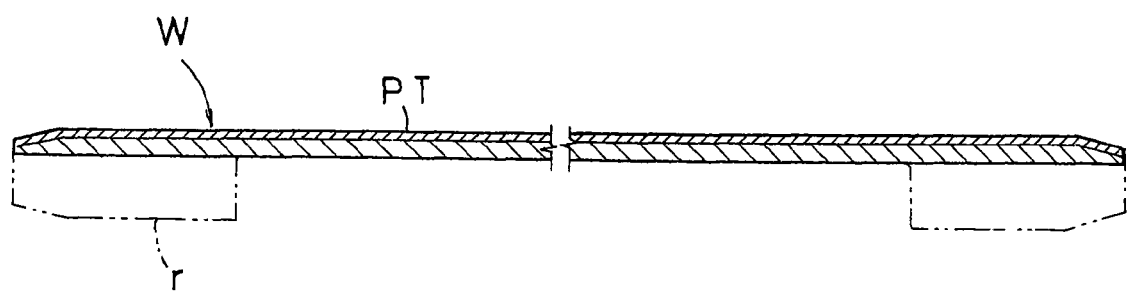
FIG. 17 is a vertical sectional view illustrating the semiconductor wafer which has been subjected to grinding.

The turn table 5 holding the wafer W placed thereon moves to the processing position of the grinding mechanism 7. Herein, an annular convex portion r left on a back face of the wafer W is ground. As illustrated in FIG. 17, specifically, the wafer W is ground so as to have a uniform thickness, and then the ground face is washed.

After the grinding process and the washing process, the turn table 5 holding the wafer W placed thereon moves to a predetermined transport position. Herein, the robot arm 8 of the transport unit 2 suction holds the back face directed upward; thus, the wafer W is transported from the grinding unit 1.

The robot arm 8 turns the wafer W upside down such that the face to which the protective tape PT is joined is directed upward. Thereafter, the wafer W is transferred to the chuck table 9. When the chuck table 9 sucks the wafer W, the robot arm 8 releases the suction of the wafer W. Thus, the wafer W is transferred from the robot arm 8 to the chuck table 9. The wafer W is subjected to inspection by the inspection unit 10 of the chuck table 9.

The inspection unit 10 optically inspects whether or not damage occurs at an outer periphery of the wafer W. As for a wafer W detected as a defective suffering damage in the grinding process, the robot arm 8 transports such wafer W to the defective collection section 12. Then, the defective collection section 12 collects the wafer W. On the other hand, as for a wafer W without damage, the robot arm 8 suction holds a back face of such wafer W, and then the chuck table 9 releases the suction of the wafer W. This wafer W is taken out of the chuck table 9, and then is transported to the mount frame preparation unit 3.

The transport chuck 20 disposed above the robot arm 8 suction holds the front face of the wafer W transported from the inspection unit 10 in a state that the back face of the wafer W is suction held by the robot arm 8 while the patterned face is directed upward. Herein, the transport chuck 20 suction holds the front face of the wafer W, and then the robot arm 8 releases the suction of the wafer W. Thus, the wafer W is transported from the robot arm 8 to the transport chuck 20.

After the transport of the wafer W, the robot arm 8 moves toward the grinding unit 1 in order to take a subsequent wafer W subjected to back grinding. Simultaneously, the transport chuck 20 which suction holds the wafer W moves downward to the alignment stage 13 located below. Then, the transport chuck 20 transfers the wafer W to the alignment stage 13. Herein, the alignment stage 13 suction holds the wafer W, and then the transport chuck 20 releases the suction of the wafer W. Thus, the wafer W is transported from the transport chuck 20 to the alignment stage 13.

After the reception of the wafer W, the alignment stage 13 moves to a processing area of the ultraviolet-ray irradiation unit 14. Herein, the ultraviolet-ray irradiation unit 14 irradiates the front face of the wafer W with ultraviolet rays to attenuate a adhesive force of the protective tape PT.

After the irradiation with ultraviolet rays, the detection unit 15 moves above the alignment stage 13. Herein, an outer peripheral shape of the wafer W is highlighted by light emitted from the light source 26 such as an LED, and the monitoring sensor 27 such as a CCD camera senses a detection site such as a notch formed at the outer periphery of the wafer W. The alignment stage 13 performs alignment on the wafer W on the basis of the notch detection information.

After performance of the alignment on the wafer W, the alignment stage 13 returns to the initial position and, also, the detection unit 15 returns to the standby position.

When the alignment stage 13 returns to the initial position, the transport chuck 20 situated above the alignment stage 13 moves downward to suction hold the wafer W. Then, the transport chuck 20 transports the wafer W to the joining section 19. Herein, the transport chuck 20 suction holds the wafer W, and then the alignment stage 13 releases the suction of the wafer W. Thus, the wafer W is transported from the alignment stage 13 to the transport chuck 20.

On the other hand, the ring frame transport mechanism 17 takes uppermost one of stacked ring frames f out of the ring frame supply section 16 by suction holding such ring frame f. The ring frame f is transferred to the alignment stage 51 once, and the alignment stage 51 performs alignment on the ring frame f. Thereafter, the ring frame transport mechanism 17 holds the ring frame f again, and moves toward the tape joining position P3.

When the ring frame transport mechanism 17 holding the ring frame f reaches the tape joining position P3, the tape supply section 29 starts to supply a dicing tape DT. Simultaneously, the joining roller 35 moves to the joining start position.

Figure 8:
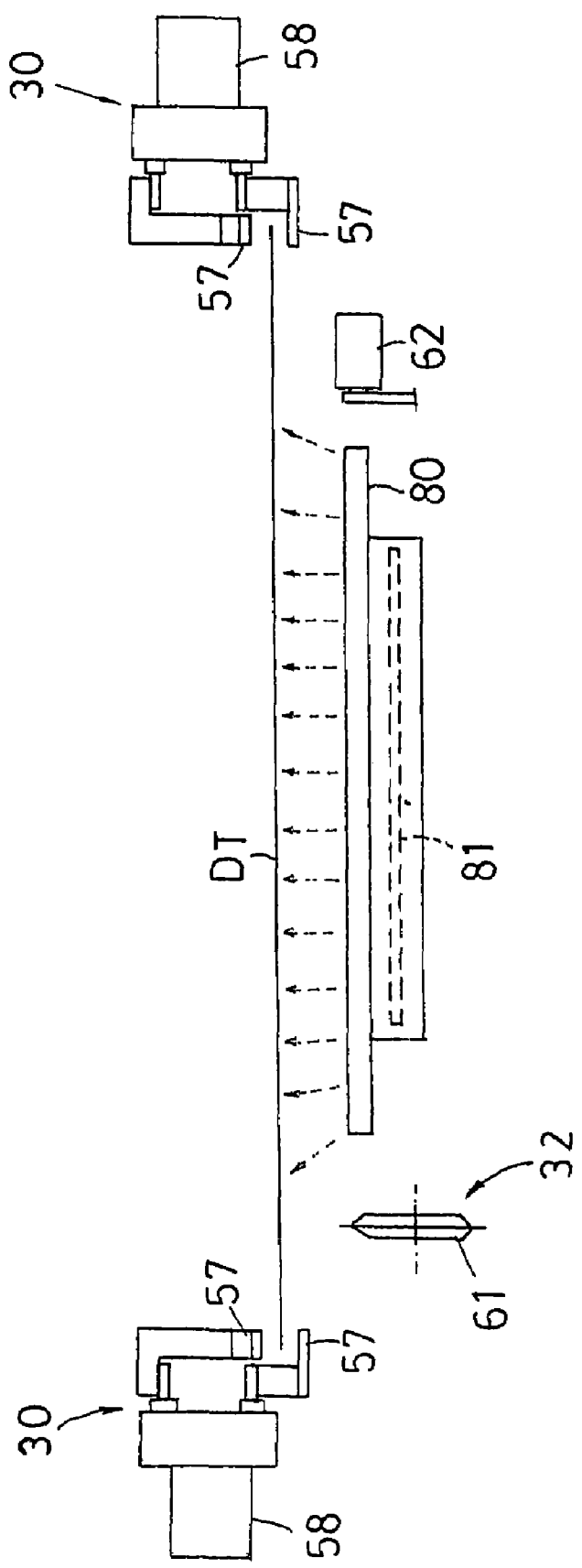
FIG. 8 is a schematic front view illustrating a step of heating a dicing tape.

As illustrated in FIG. 8, when the dicing tape DT is unreeled toward the tape joining position P3, the two pairs of chuck claws 57 of the tension application mechanisms 30 open upward and downward, respectively, to receive both end sides of the dicing tape DT in the width direction.

In addition, the tape cutting mechanism 32 and the heat radiation plate 80 move upward to be opposite to the bottom face of the dicing tape DT. Then, the dicing tape DT is widely and evenly heated by radiant heat applied from the heat radiation plate 80.

Figure 9:
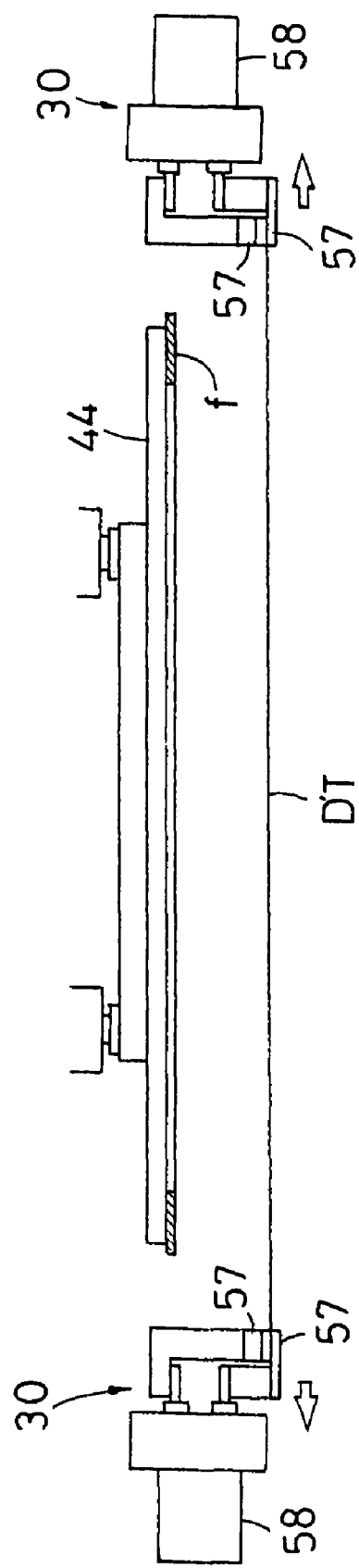
FIG. 9 is a schematic front view illustrating a step of applying a tension to the dicing tape.

As shown in FIG. 9, next, the chuck claws 57 close to grasp the both end sides of the dicing tape DT in the width direction. Further, the open/close actuator 58 retreats by the actuation of the air cylinder 59 illustrated in FIG. 5. As a result, an appropriate tension is applied to the dicing tape DT, and the dicing tape DT is pulled in the width direction. Thus, elongation of the dicing tape DT, which occurs due to heating, is absorbed, and the dicing tape DT is in a state that the appropriate tension is applied thereto without wrinkles.

Next, the alignment stage 51 in which the ring frame f is subjected to the positioning process moves to the tape joining position P3.

Figure 10:
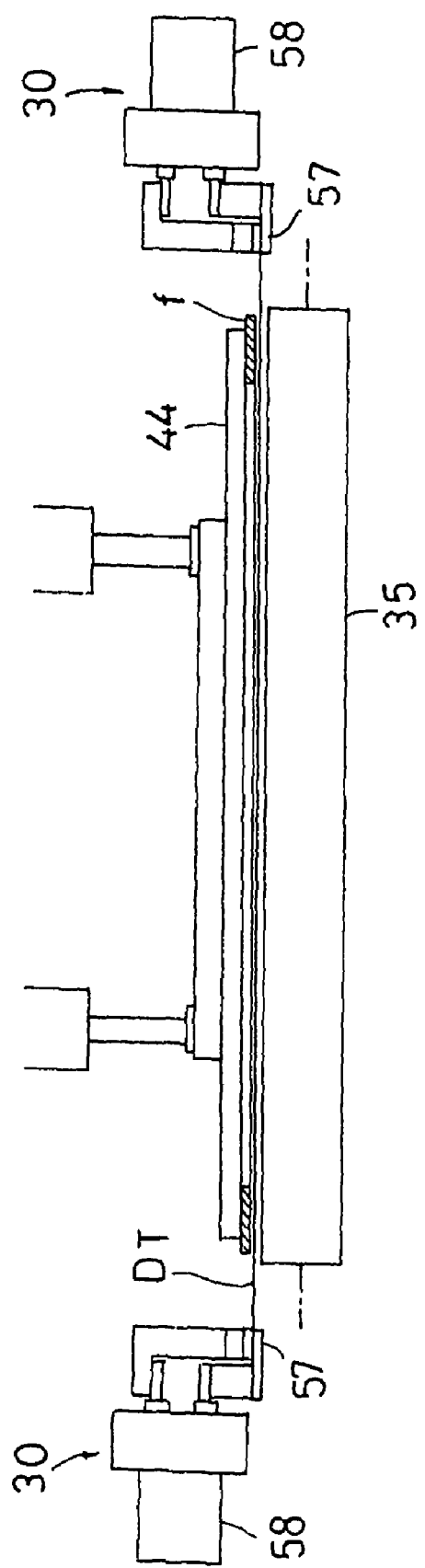
FIG. 10 is a schematic front view illustrating a step of joining the dicing tape.

As illustrated in FIG. 10, thereafter, the ring frame f is moved downward to the adhesive surface of the dicing tape DT applied with the heat and the tension. Simultaneously, the joining roller 35 moves upward to join the dicing tape DT to the bottom side of the ring frame f while pressing the dicing tape DT against the ring frame f. When the dicing tape DT is joined to one end of the ring frame f, the joining roller 35 rolls on the dicing tape DT toward the tape supply section 29, that is, the standby position illustrated in FIG. 1. Herein, the joining roller 35 rolls on the dicing tape DT while pressing the dicing tape DT from below. Thus, the dicing tape DT is joined to the bottom side of the ring frame f directed downward.

Figure 11:
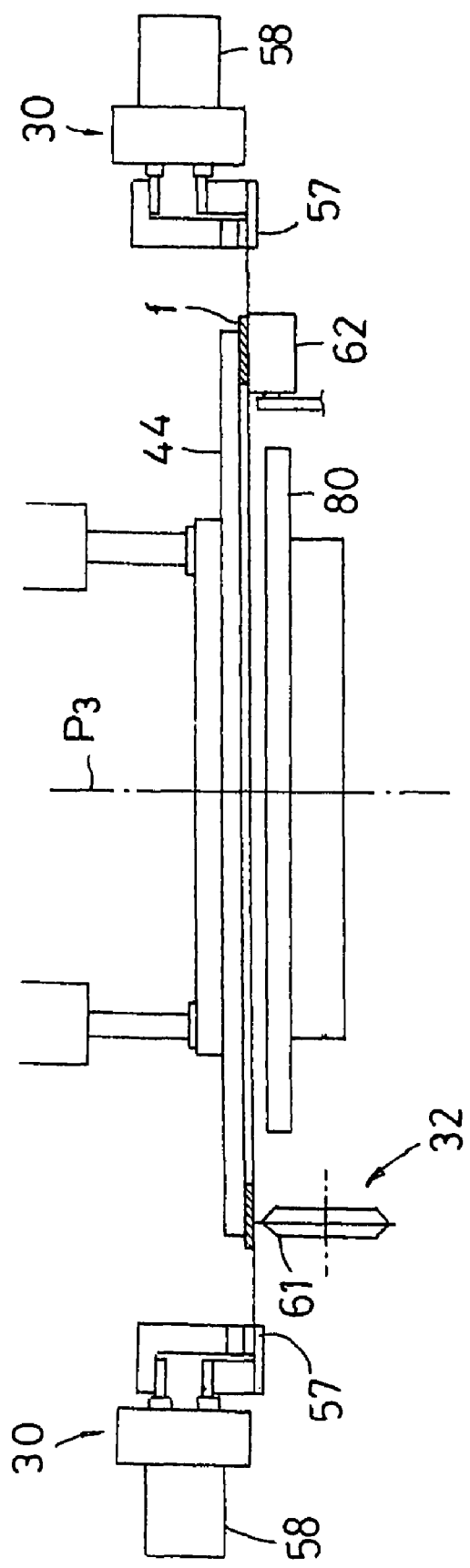
FIG. 11 is a schematic front view illustrating a step of cutting the joined dicing tape.

After completion of the joining, as illustrated in FIG. 11, the tape cutting mechanism 32 moves upward, so that the cutter 61 also moves upward to be pressed against the bottom side of the ring frame f directed downward. In this state, the cutter 61 turns about the tape joining position P3 at a predetermined radius to cut the dicing tape DT along the outer periphery of the ring frame f. Herein, the pressing roller 62 turns about the tape joining position P3 while coming into contact with the bottom side of the ring frame f at three points in a circumferential direction, so that the turning operation of the tape cutting mechanism 32 becomes stable.

After completion of the cutting of the dicing tape DT, the separation unit 33 moves toward the tape supply section 29, and then separates an unnecessary portion of the dicing tape DT.

Next, the tape supply section 29 is actuated to unreel the dicing tape DT. The unnecessary portion of the cut dicing tape DT is fed into the tape collection section 34 illustrated in FIG. 1. Herein, the joining roller 35 moves to the joining start position in order to join the dicing tape DT to a subsequent ring frame f.

The ring frame f, to which the dicing tape DT is joined, is fed into the joining section 19 by transport means (not illustrated).

Figure 12:
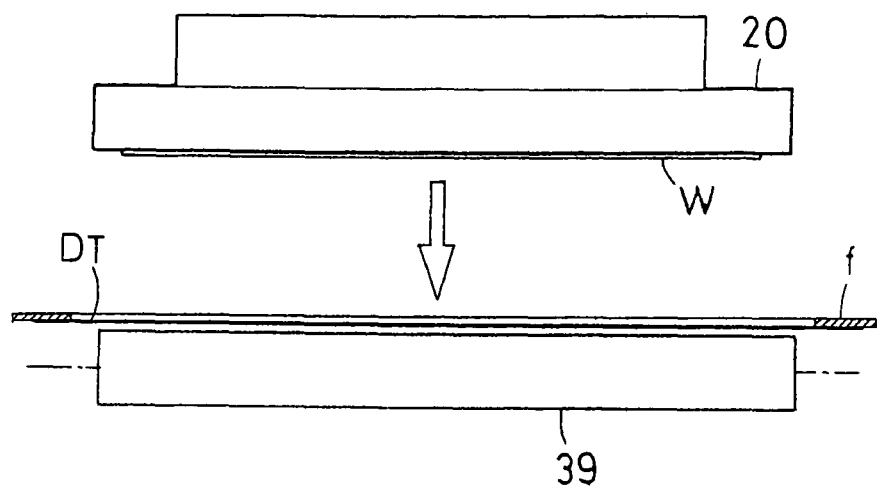
FIG. 12 is a schematic front view illustrating a step of joining a wafer.

As illustrated in FIG. 12, in the joining section 19, the transport chuck 20 moves downward to a position above the center of the ring frame f. Herein, the wafer W suction held at the bottom side of the transport chuck 20 is pressed against the adhesive surface of the dicing tape DT joined to the ring frame f in a state that the back face of the wafer W is directed downward.

Next, the joining roller 36 moves to the joining start position for the dicing tape DT. Herein, the joining roller 36 rolls on the dicing tape DT while pressing the bottom face of the dicing tape DT joined to the ring frame f against the wafer W, so that the dicing tape DT is joined to the back face of the wafer W. As a result, the ring frame f and the wafer W are integrated with each other; thus, a mount frame MF illustrated in FIG. 13 is prepared.

After the preparation of the mount frame MF, the transport chuck 20 releases the suction of the wafer W, and then returns to the position above the alignment stage 13 in preparation for a subsequent transport operation. Simultaneously, the first mount frame transport mechanism 21 transfers the mount frame MF to a separation table (not illustrated) in the protective tape separation mechanism 22.

The separation table having the mount frame MF placed thereon moves toward a position below the separation unit 33, and then joins a separating tape Ts to the protective tape PT. Simultaneously, the tape collection section 34 reels the separating tape Ts at a speed synchronized with a moving speed of the separation unit 33. Thus, the separating tape Ts is joined to the protective tape PT joined to the front face of the wafer W while being pressed against the protective tape PT. Simultaneously, the separating tape Ts is separated from the front face of the wafer W together with the protective tape PT to which the separating tape Ts is joined.

When the protective tape PT is separated from the wafer W in the mount frame MF, the mount frame MF is fed toward the standby position of the second mount frame transport mechanism 23. The second mount frame transport mechanism 23 transfers the mount frame MF fed from the protective tape separation mechanism 22 to the turn table 24. The turn table 24 performs alignment on the mount frame MF on the basis of a detection site such as a notch to adjust a housing direction. After completion of the alignment and the housing direction adjustment, the mount frame MF is pushed by the pusher, and then is housed in the mount frame collection section 25.

Thus, the series of operations performed by the semiconductor wafer mount apparatus according to this embodiment is completed, and then these operations are repeatedly performed on a subsequent wafer W.

The semiconductor wafer mount apparatus according to this embodiment can produce the following advantages. That is, since a wafer W subjected to back grinding is reinforced with an annular convex portion r formed at an outer periphery thereof, high rigidity of the wafer W can be maintained until when the wafer W is transported to the semiconductor wafer mount apparatus according to this embodiment. In addition, a series of processes from grind of the annular convex portion r for enhancing the rigidity of the wafer W to preparation of a mount frame can be performed by the semiconductor wafer mount apparatus according to this embodiment, leading to improvement in workability. Further, the wafer W from which the annular convex portion r is removed so as to have a uniform thickness is suction held constantly in a flat state during a period from the time when the wafer W from which the annular convex portion r is removed is placed on the turn table 5 to the time when the wafer W is joined to a ring frame f. Accordingly, the wafer W can be joined to the ring frame f with good accuracy in a state that the wafer W is not warped.

The present invention may be modified variously as follows.

(1) In the aforementioned embodiment, the transport unit 2 includes the chuck table 9 and the inspection unit 10, but may not include the chuck table 9 and the inspection unit 10. That is, damage of a wafer W is optically inspected by the alignment stage 13 and the inspection unit 10 in the mount frame preparation unit 3. Specifically, the alignment stage 13 is allowed to move to the position of the chuck table 9 of the grinding unit 1 illustrated in FIGS. 1 and 2, the ultraviolet-ray irradiation position of the mount frame preparation unit 3, and the initial position of the transport chuck 20. Further, the presence/absence of the damage of the wafer W is inspected based on image data about the wafer W obtained by the monitoring sensor 27 such as a CCD camera.

With this configuration, the position of the chuck table 9 illustrated in FIGS. 1 and 2 is regarded as the initial position of the alignment stage 13, and the robot arm 8 transfers the wafer W. Thus, it is possible to reduce the frequency of transport of the wafer W by the transport chuck 20, in comparison with the semiconductor wafer mount apparatus according to the aforementioned embodiment.

That is, it is possible to simplify the configuration of the semiconductor wafer mount apparatus and to reduce a cycle time.

(2) In the aforementioned embodiment, the mount frame preparation unit 3 joins a dicing tape DT to a ring frame f taken out of the ring frame supply section 16, and then supplies the ring frame f to the joining section 19. However, the present invention is not limited to this embodiment. A ring frame f to which a dicing tape DT is joined previously may be transported to the ring frame supply section 16, and then may be supplied from the ring frame supply section 16 to the joining section 19.

(3) In the aforementioned embodiment, the grinding unit 1 grinds an annular convex portion r from above in a state that a back face of a wafer W is directed upward. Alternatively, the grinding unit 1 may grind the annular convex portion r from below in the state the back face of the wafer W is directed downward.

The present invention may be embodied in other specific forms without departing from the spirit or essential attributes thereof and, accordingly, reference should be made to the appended claims, rather than to the foregoing specification, as indicating the scope of the invention.

What is claimed is:

1. A semiconductor wafer mount apparatus for manufacturing a mount frame, the semiconductor wafer mount apparatus comprising:
    a stack of semiconductor wafers each having an annular convex portion left on an outer periphery of a back face thereof;
    a grinding unit for removing the annular convex portion formed at the outer periphery of the back face of a semiconductor wafer so as to surround a flat concave portion formed by back grinding such that the semiconductor wafer has a uniform thickness;
    a transport unit for allowing a robot arm to take the semiconductor wafer, from which the annular convex portion has been removed, and to transport the semiconductor wafer to a subsequent step;
    an inspection unit for inspecting whether or not damage occurs at the outer periphery of the semiconductor wafer which has been subjected to the removal of the annular convex portion; and
    a mount frame preparation unit for joining the semiconductor wafer transported by the robot arm to the ring frame through the adhesive tape to prepare the mount frame, wherein
    the mount frame preparation unit includes:
    an alignment stage for holding the semiconductor wafer placed thereon by the robot arm such that the front face of the semiconductor wafer, to which the protective tape is joined, is directed upward;
    joining means for transporting the semiconductor wafer subjected to alignment in the alignment stage to a joining section, and joining the semiconductor wafer to a adhesive surface of the adhesive tape joined to the ring frame; and
    a protective tape separation mechanism for separating the protective tape from the front face of the semiconductor wafer in the prepared mount frame.

2. The semiconductor wafer mount apparatus according to claim 1, wherein
    the grinding unit includes:
    a wafer supply section including a cassette housing the stack of semiconductor wafers.

3. The semiconductor wafer mount apparatus according to claim 1, wherein
    the transport unit includes:
    a defective collection section for collecting the semiconductor wafer detected as a defective.

4. The semiconductor wafer mount apparatus according to claim 1, wherein
    the mount frame preparation unit includes:
    a tape processing section for joining a strip-shaped adhesive tape to a bottom side of a ring frame taken out of a ring frame supply section, and cutting the adhesive tape along the ring frame.

5. The semiconductor wafer mount apparatus according to claim 4, wherein
    the tape processing section includes:
    a cutter blade for cutting the adhesive tape while turning along the ring frame; and
    a plurality of pressing rollers each rolling on the ring frame in synchronization with a cutting operation of the cutter blade to press the adhesive tape against the ring frame.

6. The semiconductor wafer mount apparatus according to claim 4, further comprising:
    a mechanism for pulling the adhesive tape in a width direction when the adhesive tape is cut.

7. The semiconductor wafer mount apparatus according to claim 1, further comprising:
    a transport chuck for transporting the semiconductor wafer, which has been subjected to the alignment in the alignment stage, to the joining section.

8. The semiconductor wafer mount apparatus according to claim 7, wherein
    the robot arm suction holds the back face of the semiconductor wafer from which the annular convex portion has been removed by the grinding unit,
    the robot arm turns the semiconductor wafer upside down, brings the back face of the semiconductor wafer into contact with the alignment stage such that alignment stage suction holds the back face of the semiconductor wafer, and releases the suction of the semiconductor wafer,
    the alignment stage performs alignment on the semiconductor wafer, brings the front face of the semiconductor wafer into contact with the transport chuck while suction holding the back face of the semiconductor wafer such that the transport chuck suction holds the front face of the semiconductor wafer, and releases the suction of the semiconductor wafer,
    the transport chuck transports the semiconductor wafer to the joining section while suction holding the front face of the semiconductor wafer, and allows the back face of the semiconductor wafer to approach the adhesive surface of the adhesive tape joined to the ring frame,
    the joining roller rolls on a non-adhesive surface of the adhesive tape in a state that the transport chuck suction holds the front face of the semiconductor wafer, and joins the adhesive tape to the back face of the semiconductor wafer, and
    the transport chuck releases the suction of the semiconductor wafer.

9. The semiconductor wafer mount apparatus according to claim 8, wherein
    a heat radiation plate heats the adhesive tape when the adhesive tape is joined to the semiconductor wafer.

* * * * *